United States Patent [19]

Jouvet et al.

[11] Patent Number: 4,501,960
[45] Date of Patent: Feb. 26, 1985

[54] MICROPACKAGE FOR IDENTIFICATION CARD

[75] Inventors: Adrien Jouvet, Colomiers; Eric Duvois, Toulouse, both of France

[73] Assignee: Motorola, Inc., Schaumburg, Ill.

[21] Appl. No.: 275,569

[22] Filed: Jun. 22, 1981

[51] Int. Cl.³ ............................................ G06K 19/06
[52] U.S. Cl. .................................. 235/492; 235/488; 361/401
[58] Field of Search ............... 235/488, 492; 361/398, 361/401; 357/74, 80

[56] References Cited

U.S. PATENT DOCUMENTS

| | | | |
|---|---|---|---|
| 3,390,308 | 6/1968 | Marley | 361/401 X |
| 3,519,802 | 7/1970 | Cinque et al. | 235/492 X |
| 3,702,464 | 11/1972 | Castrucci | |
| 3,868,057 | 2/1975 | Chavez | |
| 4,004,133 | 1/1977 | Hannan et al. | |
| 4,054,938 | 10/1977 | Morris | 361/401 |
| 4,105,156 | 8/1978 | Dethloff | |
| 4,213,041 | 7/1980 | Smith | 235/488 X |
| 4,417,413 | 11/1983 | Hoppe et al. | 235/488 X |

OTHER PUBLICATIONS

I.B.M. Technical Disclosure Bulletin, vol. 22, No. 6, pp. 2336, 2337, Nov. 1979, K. P. Stuby, "Flexible Semiconductor Credit Card".

Primary Examiner—David L. Trafton
Attorney, Agent, or Firm—Joe E. Barbee

[57] ABSTRACT

A very thin flexible card is provided which contains electronic circuitry. The card is particularly useful as an identification card or as a credit card. The electronic circuitry is encapsulated. A first flexible sheet is provided having an opening large enough to receive the encapsulated electronic circuitry. The electronic circuitry has leads extending over the first flexible sheet. A second flexible sheet is superimposed over the first flexible sheet and has an opening large enough to accommodate the electrical leads resting on the first sheet. The electrical leads provide access to the electronic circuitry by a machine into which the card is inserted.

17 Claims, 3 Drawing Figures 4,501,960

MICROPACKAGE FOR IDENTIFICATION CARD

TECHNICAL FIELD

This invention relates, in general, to an identification or credit card, and more particularly, to a micropackage for an identification card which contains an electronic circuit and a method for making same.

BACKGROUND OF THE INVENTION

The use of identification or credit cards is becoming more and more widespread. With such a wide use of these cards greater efforts are being taken to prevent the misuse of the cards. As an example, electronic circuitry is being incorporated into the cards. Machines are then used to verify information carried in the electronic circuitry to identify the bearer of the card.

As the machines become more sophisticated more information and greater capability is given to the electronic circuitry contained in the card. One of the problems that has to be contended with is to make the card thin enough so it can easily be carried by the individual using the card. As the electronic circuitry becomes more sophisticated, it is best to integrate the circuit on a single semiconductor chip. However, semiconductor chips tend to be very fragile and therefore must be protected. The protection afforded the semiconductor chip must be thin enough to keep the card from becoming too thick.

Accordingly, it is an object of the present invention to provide an improved micropackage for identification cards which is thin, flexible and yet sufficiently protective of electronic circuitry contained in the card.

Yet another object of the present invention is to provide a thin identification or credit card which is easy and inexpensive to assembly yet highly reliable to use.

A further object of the present invention is to provide a method of assembling a thin flexible micropackage for an identification card which contains electronic circuitry.

SUMMARY OF THE INVENTION

In carrying out the above and other objects and advantages of the present invention there is provided a first sheet of flexible material having an opening therein and a semiconductor chip which is enclosed or encapsulated in a plastic compound and has leads extending from the plastic compound. The plastic compound containing the semiconductor chip fits within the opening in the first sheet and the leads of the semiconductor chip rest on one surface of the first sheet. A second flexible sheet has an opening large enough to accommodate the leads. This second sheet is superimposed upon the first flexible sheet to form a thin micropackage for an identification card.

A method of assembling the micropackage is also provided.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
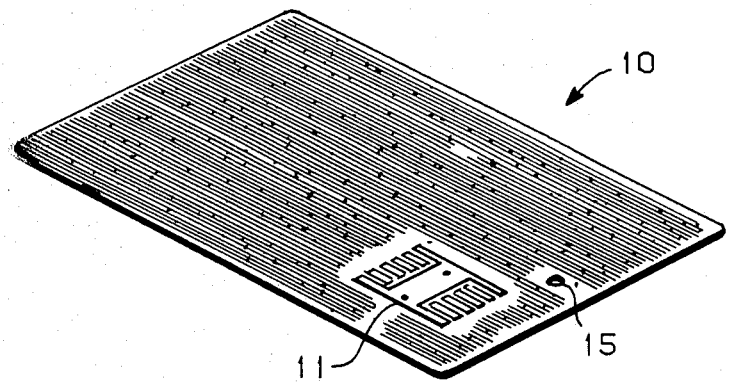
FIG. 1 is a perspective type view of the present invention in one form thereof.

FIG. 1 illustrates an overall view of the identification or credit card 10 of the present invention. As identification, the card can include electronic circuitry shown as 11 which is useful for identifying the card bearer as having access to a card controlled security area and could also have the capability of keeping track of the number of times, as well as the time of day, of entry and exit into a card controlled security area. As a credit card, the electronic circuitry could contain an identifying number for the card bearer as well as the amount of credit available to the bearer and through an appropriate machine the information on the card could be modified to indicate the balance of the credit left after use of the card. In the present invention, it is intended that the electronic circuitry 11 be a microcomputer. Card 10 has a hole 15 near one end of the card. The purpose of hole 15 is to serve as an indent and receives a pin from a machine (not shown) which would be used to energize and read data into or out of electronic circuitry 11. When the pin falls into hole 15, it would indicate that card 10 is in proper position for electronic circuitry 11 to be mated to the machine.

The size of card 10 is wallet-size or the size of a typical credit card. It will be understood, however, that card 10 can be of any convenient or desirable size. Card 10 serves as a holder for electronic circuitry 11 and is thin and flexible whereas circuitry 11 is substantially rigid in its preferred embodiment.

Figure 2:
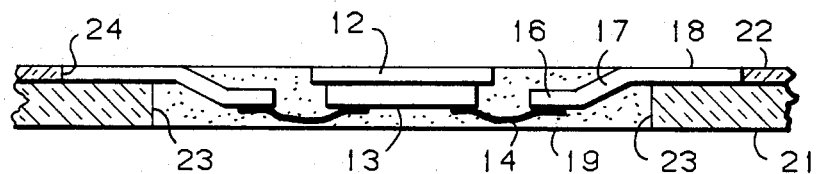
FIG. 2 is a cross sectional view of a portion of FIG. 1, wherein the cross sectional view is taken through a portion of the semiconductor chip.

FIG. 2 is a cross sectional view of a portion of card 10 shown in FIG. 1. The cross sectional view shows electronic circuitry 11. Card 10 contains two sheets 21 and 22 of plastic. The plastic can be any suitable flexible sheet material such as PVC or the like. Flexible sheet 21 has an opening 23 which receives electronic circuitry 11. Circuitry 11 comprises a semiconductor chip 13 having thin wires 14 connecting semiconductor chip 13 to electrical leads 17. Electrical leads 17 have a first portion 16 and a second portion 18. Portion 16 is on the same plane as semiconductor chip 13 whereas second portion 18 of electrical leads 17 rests on a shoulder formed by one surface of sheet 21. Semiconductor chip 13 is bonded to a flag 12. Flag 12 serves to give some protection to semiconductor chip 13 and also serves as a heat sink for chip 13. In a preferred embodiment, leads 17 and heat sink 12 are stamped from the same metallic material. This material is preferably a soft metal such as copper or the like so that leads 17 can flex at the edge of opening 23.

Semiconductor chip 13, wires 14, and first portion 16 of electrical leads 17 are enclosed by an encapsulant 19. Encapsulation material 19 can be any suitable plastic material such as an epoxy compound or the like. Material 19 forms a substantially rigid body around chip 13. Electronic circuitry 11 is placed in opening 23 so that lead portions 18 rest upon a surface of plastic sheet 21. In a preferred embodiment, an adhesive is used under electrical lead portions 18. Since leads 17 are flexible and by holding one end of the leads 17 fixed by encapsulant 19 and the other end fixed by adhesive, the leads can flex at the edge of opening 23.

Plastic sheet 22 is superimposed upon sheet 21. In a preferred embodiment, sheet 22 is of the same thickness as electrical lead portions 18 thereby providing a smooth upper surface to the credit card. Electrical lead portions 18 serve as electrical connections between a machine into which card 10 will be inserted and semiconductor chip 13. As mentioned hereinbefore, in a preferred embodiment, semiconductor chip 13 is a microprocessor including memory, which combination is commonly called a microcomputer. The purpose of encapsulating material 19 is to maintain a substantially fixed relationship between chip 13 and electrical lead portion 16. Note that encapsulant 19 does not surround the top side of heat sink 12 so that heat sink 12 can be placed against a machine into which card 10 is inserted to transfer heat away from electronic circuit 11 when circuit 11 is energized. Power, as well as, input and output data can be conveyed to circuit 11 through leads 17.

The bend in electrical leads 17 helps to keep electronic circuit 11 thin by providing one end near chip 13 and the other end on the same plane as heat sink 12. In a preferred embodiment, heat sink 12 and leads 17 are 0.25 millimeters thick, chip 13 is 0.25 millimeters thick, and encapsulant 19 is 0.3 millimeters thick over chip 13 thereby resulting in a card 10 which is 0.8 millimeters thick.

Figure 3:
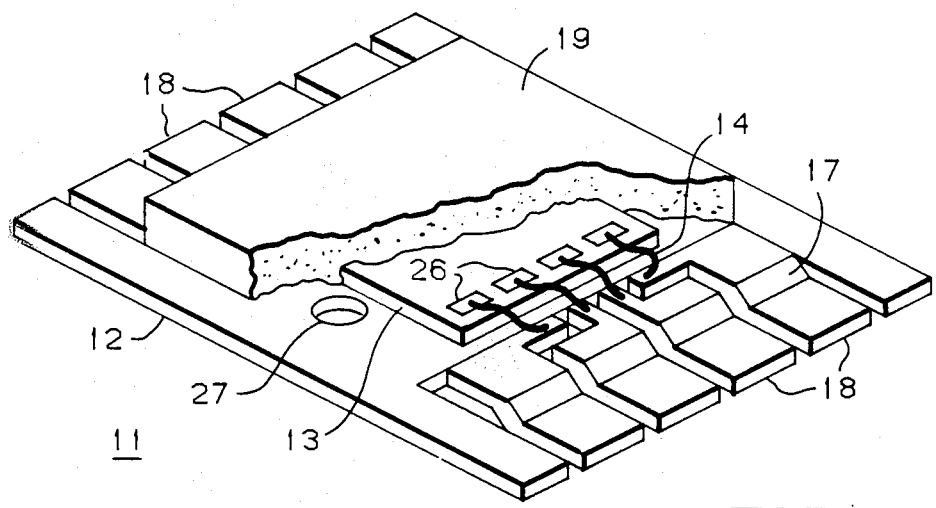
FIG. 3 is a perspective type view of the semiconductor chip used in the present invention wherein a portion of the encapsulating material is cut away.

FIG. 3 shows electronic circuitry 11 with a portion of encapsulating material 19 cut away. Semiconductor chip 13 has contact pads 26 to which one end of wires 14 are attached. The other end of wires 14 is attached to electrical leads 17. Note how electrical lead portions 18 and the ends of heat sink 12 are not enclosed by encapsulating material 19. Semiconductor chip 13 is bonded to heat sink 12. Heat sink 12 is illustrated as having a hole 27. The purpose of hole 27 is to better grip encapsulating material 19 when electronic circuitry 11 is encapsulated by allowing material 19 into hole 27. In a preferred embodiment heat sink 12 would have two holes 27, one on either side of semiconductor chip 13.

A method for assembling card 10 can be better understood by reference to FIG. 2. Electronic circuitry 11 is encapsulated before being placed into openings 23 and 24. A flexible sheet 21 is provided having an opening 23. Electronic circuitry 11 can be placed within opening 23 having the electrical lead portions 18 resting on one surface of sheet 21. A second flexible sheet 22 is provided having an opening 24 which is large enough to accommodate electrical leads 17. The resulting thickness of card 10 is approximately 800 microns or 0.8 millimeters A preferred method of assembling card 10, is to provide a first sheet 21 having openings 23 and superimposing a second sheet 22 having openings 24 over first sheet 21 and attaching sheets 21 and 22 together either by heat bonding or by using a suitable adhesive. Then electronic circuit 11 is inserted into the openings in sheets 21 and 22. Adhesive is used under leads 18 to hold circuit 11 in situ.

By now it should be appreciated that there has been provided a very thin flexible card which can be used for identification purposes or as a credit card depending upon the type of electronic circuitry included in the card. The card is easily and inexpensively assembled yet highly reliable.

We claim:

1. A micropackage identification card adapted to be carried and used by an individual and having machine-readable identifying information, comprising:
an integrated semiconductor device enclosed in encapsulating material and having electrical terminals extending from the encapsulating material; a first flexible sheet having an opening adapted to accommodate the integrated semiconductor device, the electrical terminals of the integrated semiconductor device being adapted to lie along a surface of the first flexible sheet; and a second flexible sheet having an opening larger than the opening in the first flexible sheet, the second flexible sheet being superimposed over the first flexible sheet in a manner to accommodate the electrical terminals in the opening of the second flexible sheet so that the electrical terminals are accessible for contact by a machine used to read the identifying information.

2. The micropackage identification article of claim 1 wherein the semiconductor device is mounted on a heat sink located on a plane level with the electrical terminals.

3. The micropackage identification card of claim 1 wherein the electrical terminals are of a thickness substantially equal to thickness of the second flexible sheet.

4. The micropackage identification card of claim 1 wherein the encapsulating material is an epoxy compound.

5. The micropackage identification card of claim 1 wherein the first and second flexible sheets are cut to a predetermined size and are made of PVC.

6. The micropackage identification card of claim 1 wherein the integrated semiconductor device includes a microprocessor and memory.

7. A thin flexible credit card size of article having a microprocessor and memory integrated into a single semiconductor chip, the semiconductor chip having contact pins which are attached to electrical terminals by wires, the electrical terminals having a first and a second portion, the wires being attached to the first portion, the electrical terminals being bent between the first and second portions, the semiconductor chip, wires, and first portion of the electrical terminals all being encapsulated, a first layer of flexible material having an opening and forming one surface of the credit card size article, the opening being large enough to receive the encapsulated semiconductor chip and first portion of the electrical terminals, the second portion of the electrical terminals resting upon a surface of the first layer of flexible material, a second layer of flexible material having an opening large enough to fit over the second portion of the terminals, the second layer of flexible material being superimposed over the first layer of flexible material to form the thin flexible credit card size article.

8. The article of claim 7 further including a heat sink attached to the semiconductor chip and being at a planar level substantially equal to the second portion of the electrical terminals.

9. A method for making an identification card having a microcomputer within the card, comprising: providing a microcomputer chip having electrical leads extending therefrom; providing a first sheet of flexible material; making an opening in the first sheet of flexible material large enough to accept the microcomputer chip; providing a second sheet of flexible material of substantially of equal thickness as the electrical leads; making an opening in the second sheet of flexible material large enough to accept the electrical leads; attachingly superimposing the second sheet of flexible material over the first sheet of flexible material to form the identification card; and placing the microcomputer in the opening of the first sheet of flexible material so that the electrical leads rest on one surface of the first sheet of flexible material and fit within the opening in the second sheet of flexible material.

10. The method of claim 9 wherein the electrical leads are adhesively attached to the first sheet of flexible material.

11. An identification card having secret identifying information stored within a microcomputer packaged as part of the identification card, comprising: said microcomputer being contained on a single integrated chip and having electrical leads extending therefrom, the electrical leads being on a planar level even with a surface of the chip; a first sheet of material having an opening to accommodate the chip with the electrical leads resting outside the opening on a surface of the first sheet; and a second sheet of material superimposed over the first sheet and having an opening to accommodate the electrical leads thereby forming the identification card.

12. The identification card of claim 11 further including an adhesive on the surface of the first sheet to hold the electrical leads in situ.

13. A wallet-size identification card made of a plastic laminate and having a microcomputer included in the card, the microcomputer being an encapsulated semiconductor chip having interface contact pads mated to electrical leads by wires, the electrical leads having a first portion encapsulated with the chip and wires and having a second portion external to the encapsulated chip and being bent to be on a plane with a surface of the encapsulated chip, a first sheet of plastic having an opening large enough to accommodate the encapsulated chip with the second portion of the external leads resting on a surface of the first sheet, and a second sheet of plastic laminated to the first sheet and having an opening large enough to accommodate the second portion of the electrical leads.

14. The wallet-size identification card of claim 13 wherein the semiconductor chip, wires and first portion of electrical leads are encapsulated in plastic.

15. The wallet-size identification card of claim 14 wherein the first and second sheets of plastic are PVC.

16. The wallet-size identification card of claim 14 wherein the first sheet of plastic is as thick as the encapsulated semiconductor chip minus the thickness of the second portion of the electrical leads.

17. The wallet-size identification card of claim 16 wherein the semiconductor chip is attached to a flat heat sink prior to being encapsulated, the heat sink being of the same thickness as the electrical leads and a surface of the heat sink being exposed from the encapsulating plastic.

* * * * *